United States Patent
Chaput et al.

(10) Patent No.: US 6,808,761 B2
(45) Date of Patent: Oct. 26, 2004

(54) METHOD OF FORMING A CERAMIC COATING ON A SUBSTRATE BY ELECTRON-BEAM PHYSICAL VAPOR DEPOSITION

(75) Inventors: Christophe Chaput, Le Palais sur Vienne (FR); Cyrille Delage, Limoges (FR); André Malie, Chatellerault (FR); Isabelle Porte, Condat sur Vienne (FR); Bertrand Saint-Ramond, Fontainebleau (FR)

(73) Assignee: Snecma Moteurs, Paris (FR)

( * ) Notice: Subject to any disclaimer, the term of this patent is extended or adjusted under 35 U.S.C. 154(b) by 0 days.

(21) Appl. No.: 10/417,175

(22) Filed: Apr. 17, 2003

(65) Prior Publication Data
US 2004/0058200 A1 Mar. 25, 2004

(30) Foreign Application Priority Data
Apr. 22, 2002 (FR) .............................. 02 04982

(51) Int. Cl.$^7$ ............................... C23C 14/30
(52) U.S. Cl. ............ 427/596; 427/255.32; 427/255.34; 427/255.36
(58) Field of Search ........................... 427/596, 255.32, 427/255.34, 255.36

(56) References Cited

U.S. PATENT DOCUMENTS 5,834,070 A * 11/1998 Movchan et al. ........... 427/566
6,168,833 B1 * 1/2001 Leushake et al. ........ 427/248.1

* cited by examiner

*Primary Examiner*—Timothy Meeks
(74) *Attorney, Agent, or Firm*—Oblon, Spivak, McClelland, Maier & Neustadt, P.C.

(57) ABSTRACT

A composite target is placed in a chamber. The target is in the form of a bar made of ceramic powder and it presents composition that is not uniform in the longitudinal direction. At least one substrate is introduced into the chamber in order to have formed thereon a ceramic coating with a composition gradient. The top face of the bar is swept by an electron beam so as to melt the bar material at its top face and form a vapor cloud in the chamber under low pressure. A bar is used that presents a plurality of superposed layers of different compositions, with the composition within each layer being uniform over the entire cross-section of the bar. Each layer of the bar comprises zirconia and at least one oxide selected from the oxides of nickel, cobalt, iron, yttrium, hafnium, cerium, lanthanum, tantalum, niobium, scandium, samarium, gadolinium, dysprosium, ytterbium, and aluminum.

12 Claims, 3 Drawing Sheets

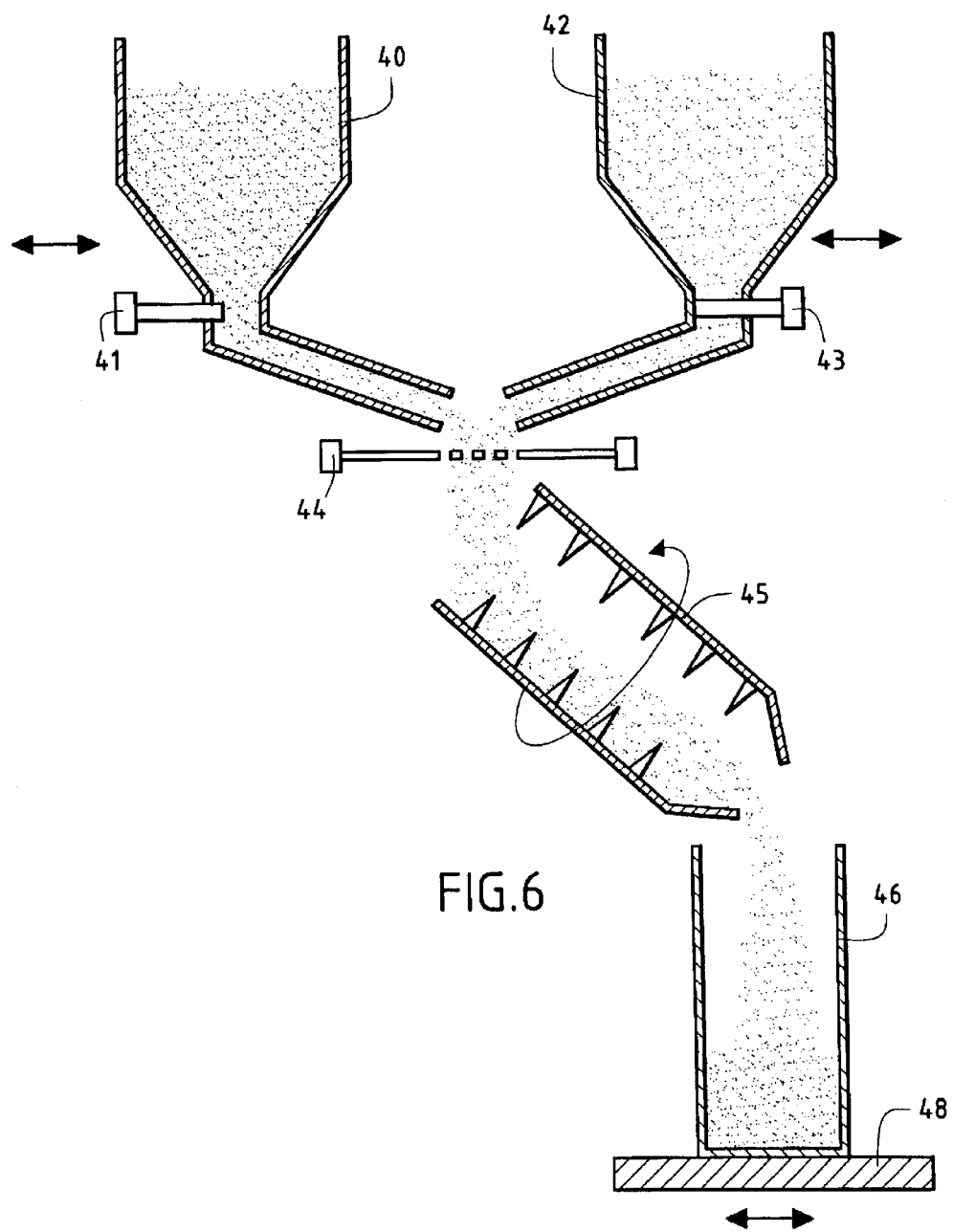

METHOD OF FORMING A CERAMIC COATING ON A SUBSTRATE BY ELECTRON-BEAM PHYSICAL VAPOR DEPOSITION

BACKGROUND OF THE INVENTION

The invention relates to forming ceramic coatings on substrates, and in particular to making bars or targets suitable for use as sources for forming such coatings by electron-beam physical vapor deposition.

A particular field of application of the invention lies in forming outer ceramic coatings on thermal barriers for metal parts made of superalloys, such as blades or nozzles in gas turbines.

In order to optimize the operation of gas turbines, in particular turbojets, it is desirable to make them operate at temperatures that are as high as possible, thereby increasing efficiency, reducing specific fuel consumption, and reducing polluting emissions (oxides of carbon, sulfur, nitrogen) and unburnt fuel.

The parts of turbojets that are exposed to the highest temperatures, and in particular the turbine nozzles and blades, are usually made of refractory metal alloys, or superalloys, based on nickel or cobalt, and they are provided with protective coatings.

Such protective coatings are generally multilayer coatings that form heat barriers and that are made up firstly of an outer coating made of a ceramic having low thermal conductivity, and secondly of an inner coating made of metal that protects the superalloy against oxidation and corrosion and that enhances bonding with the outer ceramic coating. The metal inner portion of the coating, or thermal barrier underlayer, is usually of the aluminide type. It may also be of the MCrAlY type where the metal M is Ni, Co, or Ni+Co. A film of alumina develops at the surface of the underlayer, thus enhancing bonding with the outer ceramic coating.

The outer ceramic coating is generally made by a electron-beam physical vapor deposition. Such a method enables a coating to be grown that has columnar morphology that is well suited to withstanding the thermomechanical stress differences in the various layers of the thermal barrier.

This deposition method, known by its abbreviation EBPVD, consists in introducing one or more substrates into a deposition chamber in which a source-forming bar or target has been placed of composition corresponding to that of the ceramic coating that is to be formed. In the particular intended application, the substrates are metal parts made of superalloy and already provided with a metal underlayer of a thermal barrier.

The bar is placed vertically and its top surface is swept by an electron beam which leads to surface melting of the bar material. The chamber is under a vacuum, thus allowing a cloud to form coming from evaporation of the bar material. The evaporated material deposits by condensing on the substrates which are caused to rotate in front of the evaporation cloud. The process is continued until the desired thickness has been obtained for the coating, with the bar being consumed progressively.

The material most commonly used for the ceramic layers of thermal barrier coatings for gas turbine parts made of superalloy is zirconia ($ZrO_2$) stabilized by yttrium oxide ($Y_2O_3$) known as "yttrium-stabilized zirconia" or "YSZ".

Nowadays, and even more in the future, the performance required of these ceramic coatings is such that they can no longer be made as a coating constituted by one layer of a single ceramic material.

That is why proposals have been made to make multilayer ceramic coatings with layers of different compositions that perform different functions.

Thus, U.S. Pat. No. 5,683,825 describes a ceramic coating with a layer of erosion-resistant material made of alumina or silicon carbide deposited by physical vapor deposition on a layer of columnar YSZ.

Patent application WO 00/09778 describes a ceramic coating having a top layer made of zirconia stabilized with hafnium or scandium oxide possessing high thermal stability at high temperatures, and a lower layer of YSZ providing bonding with the metal underlayer.

Once the provision of multilayer ceramic coatings requires a plurality of deposition cycles to be performed using different sources, costs become very high.

Proposals have been made to provide ceramic coatings in a continuous stage, but at the price of making the physical deposition method more complex.

Thus, European patent application EP 0 705 912 proposes reducing thermal conductivity by alternating electron-beam physical vapor deposition (EBPVD) with plasma-assisted physical vapor deposition (PAPVD).

In application WO 96/11288, thermal conductivity is reduced by alternating deposits of nanometer layers of YSZ and of alumina, the deposits being formed by EBPVD using two distinct sources.

U.S. Pat. No. 5,350,599 proposes making a multilayer structure by modifying the morphology of consecutive layers of the same composition by varying the rotation of the substrates to be coated.

As for U.S. Pat. No. 5,792,521, it proposes making multilayer deposits by scanning different sources formed by targets positioned in a special manner in the deposition chamber.

Proposals have also been made to make a protective coating that presents a composition gradient within its thickness by using EBPVD and a bar or source that contains the various components for the layers of the coating.

Thus, U.S. Pat. No. 6,287,644 describes a process during which the various components of the bar are evaporated in succession in order of decreasing vapor pressure. A protective coating is thus formed whose composition varies continuously from a metal underlayer deposited on a superalloy part to an outer ceramic coating.

Patent application EP 1 096 037 describes using a bar constituted by a composite ingot made up of a block of YSZ having inserts included therein, the inserts being made of metal, or of a metal-ceramic mixture, or of ceramic, each insert occupying a fraction of the cross-section of the ingot.

In the last two methods mentioned above, the surface scanned by the electron beam always contains materials for different layers of the coating that is to be formed. In spite of having different vapor pressures, it is not possible in practice to control the method in such a manner as to obtain a precise predetermined composition in each layer of the resulting coating.

In addition, it is difficult to make an ingot having inserts of different shapes as in EP 1 096 037.

A physical vapor deposition method using an ingot made up of non-sintered ceramic powders of different grain sizes is described in U.S. Pat. No. 6, 168,833.

The possibility of varying the composition of the ingot in order to make a coating with a composition gradient is mentioned but without further details.

Finally, European patent EP 1 158 061 discloses a method of forming a stratified material made up of powder layers having different compositions which are compressed in a mold and sintered. The material is used for making a cylindrical or rectangular bar by cutting through the superposed layers of material. The bar is subjected to heat treatment so as to form, by melting, a fiber having a composition gradient.

OBJECT AND SUMMARY OF THE INVENTION

An object of the present invention is to enable a ceramic coating to be made having a composition gradient across its thickness, and to do so by using an EBPVD method in a single continuous deposition cycle without the method or the deposition installation being particularly complicated and with the composition of the various layers of the coating being accurately controlled.

In a first aspect, the invention provides a method comprising the steps of:

placing in a chamber a composite target in the form of a bar made up of ceramic powder and presenting a composition that is not uniform in the longitudinal direction;

introducing into the chamber at least one substrate on which a ceramic coating having a composition gradient is to be formed; and sweeping a top face of the bar with an electron beam in order to melt the bar material at its top face and form a vapor cloud in the chamber at low pressure, in which method a bar is used that presents a plurality of superposed layers of different compositions, the composition within each layer being uniform over the entire cross-section of the bar, and each layer comprising zirconia and at least one oxide selected from the oxides of nickel, cobalt, iron, yttrium, hafnium, cerium, lanthanum, tantalum, niobium, scandium, samarium, gadolinium, dysprosium, ytterbium, and aluminum, in such a manner that the ceramic coating formed on the substrate by progressively consuming the bar reflects the variation in the composition of the bar.

The composition of the bar may vary from one layer to another either stepwise or progressively.

Each layer of the bar comprises zirconia, and advantageously stabilized zirconia. One or more components other than stabilized zirconia are added so as to confer one or more particular functions to the ceramic coating.

The function of bonding the coating to the substrate can be encouraged by adding yttrium oxide to the zirconia, one or more layers of the bar, at least in its first-consumed portion, then comprising YSZ.

The function of decreasing thermal conductivity may be provided by adding at least one component selected from the oxides of nickel, cobalt, iron, yttrium, hafnium, cerium, lathanum, tantalum, niobium, scandium, samarium, gadolinium, dysprosium, and ytterbium.

The function of providing resistance to abrasion in the surface layers can be enhanced by the presence of alumina.

The function of thermal stability can be reinforced by the presence of at least one component selected in particular from the above-mentioned oxides having a function to reduce thermal conductivity, together with a compound selected from compounds of pyrochlore structure, compounds of garnet type, and compounds of magnetoplumbite structure.

The composition gradient between two layers within the bar can be obtained by varying the proportions of the same components constituting two layers or by making the two layers with different components.

The present invention also provides a bar suitable for constituting a target or a source for implementing the method, and a method of manufacturing such a bar.

BRIEF DESCRIPTION OF THE DRAWINGS

The invention will be better understood on reading the following description given by way of non-limiting indication and made with reference to the accompanying drawings, in which:

FIG. 6 is a highly diagrammatic view showing another installation for making a composite bar in accordance with the invention.

DETAILED DESCRIPTION OF EMBODIMENTS

In the description below, reference is made to the particular field of application of the invention which consists in making outer ceramic coatings on thermal barrier underlayers for parts in the hot portions of gas turbines, such as the moving blades or the nozzles made of superalloy for a turbojet. Nevertheless, the invention is applicable to making ceramic coatings with a composition gradient on substrates other than parts that are made of superalloy and provided with a thermal barrier metal underlayer.

Various methods exist for making a thermal barrier metal underlayer on a superalloy part, in particular for making an underlayer out of a material of the aluminide type. Such methods, which do not come within the ambit of the present invention, are not described herein in detail. The technique that is most commonly used is aluminizing by cementation.

It is also well known to introduce an active element in the aluminide type metal underlayer, which active element reinforces the diffusion barrier function against elements of the superalloy metal. Such elements would otherwise be liable to affect the integrity and the persistence of the alumina film that forms on the surface of the underlayer and that enhances bonding of the ceramic coating. These active elements are constituted in particular by zirconium, hafnium, yttrium, and the lanthanides. The active element(s) may be alloyed or associated separately with one or more constituents of the metal underlayer in order to be deposited together by a physical vapor deposition process, or they may be of a composition of the MCrAlY type where M is Ni and/or Co and/or Fe, for deposition by electrophoresis or by aluminizing, or the active element(s) may be incorporated in a cement.

Figure 1:
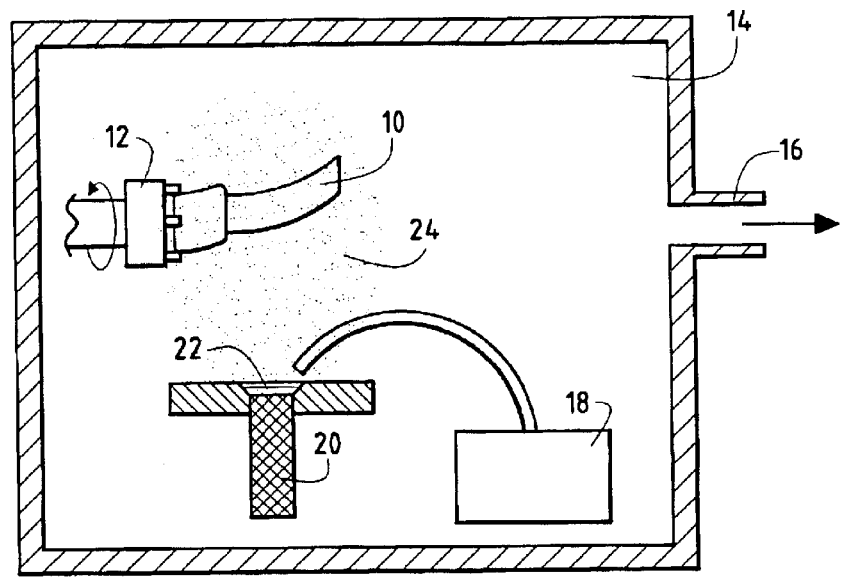
FIG. 1 is a highly diagrammatic view of a deposition chamber for forming coatings on substrates by the EBPVD method.

In order to form the ceramic coating, one or more substrates constituted by superalloy parts provided with a thermal barrier metal underlayer are placed in a deposition chamber for deposition by EBPVD as shown highly diagrammatically in FIG. 1.

The or each substrate 10 (only one is shown) is mounted on a rotary support 12 inside the chamber 14. The chamber is connected to a vacuum source (not shown) by a pipe 16.

A generator 18 situated in the chamber produces an electron beam which is directed towards the top face of a target or source 20. This target is in the form of a cylindrical bar placed vertically. The top face of the bar 20 lies flush in a cup 22.

Under the effect of electron-beam scanning, the top portion of the bar 20 melts, and because of the vacuum that exists inside the chamber, a cloud of vapor 24 is formed. The vapor condenses on the substrate 10 which is rotated so as to form a deposit that is uniform. The material that is deposited is determined by the composition of the bar 20.

A deposition chamber for EBPVD as described briefly above is well known, so a more detailed description is unnecessary.

In the invention, a ceramic deposit with a composition gradient is formed on the substrate by using a composite bar which reproduces along its length the composition of the coating that is to be formed.

As mentioned above, a ceramic outer coating for a thermal barrier on a superalloy gas turbine part is usually made of zirconia, preferably zirconia stabilized with yttrium oxide to enhance bonding to the metal underlayer. One or more other components, generally but not necessarily in the form of oxides, can be introduced at various levels in the coating in order to confer particular properties thereto, or to reinforce its properties.

Thus, the thermal conductivity of the coating can be reduced by introducing at least one component selected in particular from oxides of nickel, cobalt, iron, yttrium, hafnium, cerium, lanthanum, tantalum, niobium, scandium, samarium, gadolinium, dysprosium, and ytterbium. The component(s) (other than yttrium) is/are preferably introduced in one or more layers of the coating other than the bottom layer(s) so as to avoid affecting bonding on the metal underlayer.

The abrasion resistance of the coating can be improved by introducing alumina in the top layer(s).

The thermal stability of the coating can be reinforced by adding in one or more layers at least one compound selected from compounds of pyrochlore structure, compounds of garnet type ($Y_3Al_5O_{12}$), and compounds of magnetoplumbite structure ($LaMgAl_{11}O_{19}$).

The major fraction of the coating is preferably formed of YSZ in all of its layers. The additional component(s) is/are preferably present, possibly in each layer of the coating, up to a maximum concentration of 20% by weight.

The composition gradient of the coating may be the result of the proportions of these constituents varying from one layer to another, the constituents themselves remaining the same, and/or it may result from the composition changing from one layer to another.

Such variation from one layer to another can be implemented stepwise. This is shown very diagrammatically in FIG. 2 where the bar 20 comprises a finite number of layers 20a, 20b, . . . which are different and clearly distinguished from one another. The layers may be of different thicknesses.

Figure 3:
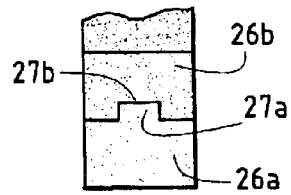
FIG. 3 is a fragmentary diagrammatic view in section showing how two consecutive disks making up a composite bar are assembled together.

The bar 20 may be made as a single piece, or as shown in FIG. 3 it may be made as a plurality of superposed pieces or disks 26a, 26b, . . . of different compositions. The disks may be flat and merely superposed, or they present complementary portions in relief 27a, 27b such as studs and recesses or tongues and grooves making them easier to assemble and providing a stronger bar.

Figure 4:
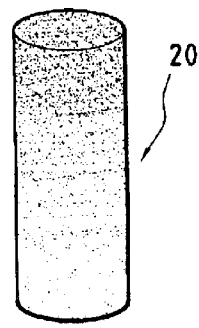
FIG. 4 is a diagrammatic view of an embodiment of a composite bar in another implementation of the invention.

In a variant, the composition of the bar may vary continuously as shown diagrammatically in FIG. 4, with the bar 20 then being made up of a quasi-infinity of layers.

Whatever the embodiment used, within any one layer, the bar 20 presents a composition that is uniform throughout its cross-section.

As the bar is consumed, the coating formed on the substrate reproduces the composition gradient of the bar. Because each layer of the bar is of uniform composition, the bath formed at the surface of the bar is of homogenous composition corresponding to the composition of the layer that is flush therewith. As a result, the composition of each layer of the coating that is formed can be controlled accurately, and the composition gradient of the coating is a reflection of the composition gradient of the bar.

The bar, or each layer or disk making it up, is advantageously made by mixing, compressing, and sintering ceramic powders.

In a first embodiment, which is more particularly suitable for a bar whose composition varies stepwise, the ceramic powders constituting each layer are mixed separately.

The powders are mixed in a liquid medium, for example in water or in an organic solvent. An organic binder may be added to the resulting slip so as to facilitate subsequent pressing of the powders. The powder mixtures, possibly including binder, are subsequently dried.

Figure 2:
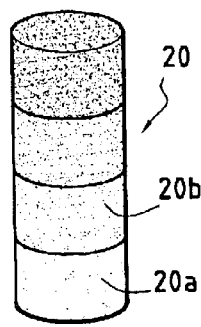
FIG. 2 is a diagrammatic view of an embodiment of a composite bar in one implementation of the invention.

In the embodiment of FIG. 2, where the bar is made as a single piece, the compositions as prepared in this way for the various layers are introduced in the appropriate order into a mold having the form of the bar that is to be made.

Figure 5:
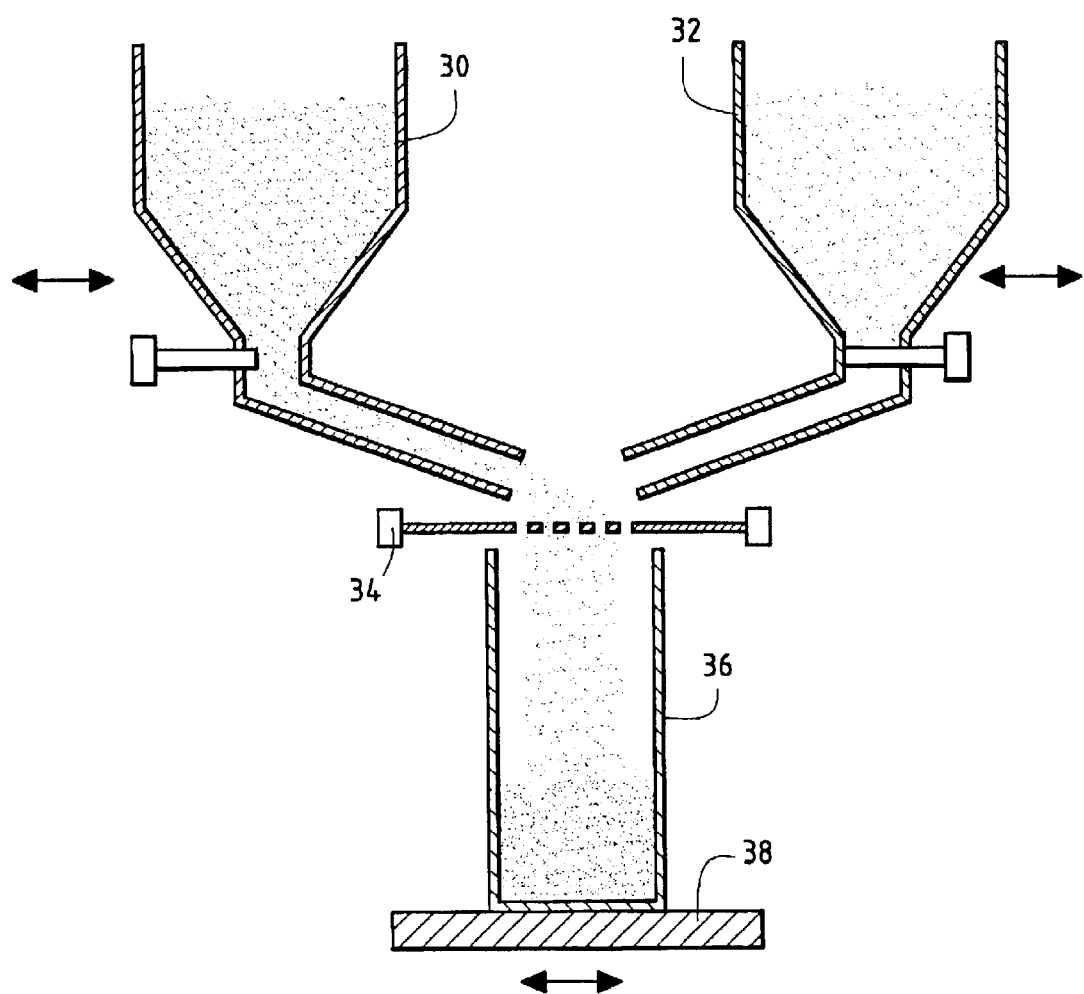
FIG. 5 is a highly diagrammatic view showing an installation for making a composite bar in accordance with the invention.

As shown in FIG. 5, these compositions may be stored in respective vibrating dispensers 30, 32 (only two are shown). The outlets from the dispensers are opened sequentially in the desired order. The powders pass through a grid or screen 34 and are received in the mold 36 which is carried on a vibrating table 38. The quantity of powder taken from each dispenser corresponds to the thickness desired for the corresponding layer of the bar that is to be made.

After the various powder mixtures have been introduce into the mold, compression is performed by cold isostatic pressing. The applied compacting pressure preferably lies in the range 5 megapascals (MPa) to 150 MPa. Baking is subsequently performed in an oven by raising the temperature to a maximum value that preferably lies in the range 800° C. to 1500° C., with the rate of temperature rise being controlled so as to eliminate any organic substances that might be present without damaging the cohesion of the bar. This provides a one-piece bar having separate layers of composition that varies stepwise.

In the embodiment shown in FIG. 3, each disk is made separately by molding a suitable powder mixture, compacting by cold isostatic pressure, and baking under conditions similar to those described above.

In the embodiment of FIG. 4, various mixtures of powders are prepared separately, one comprising stabilized zirconia, e.g. YSZ, and each of the others comprising the same stabilized zirconia together with a respective additional component that needs to be included at one or more levels of the bar. The percentage by weight of the additional component added to the YSZ in each mixture corresponds to the maximum that is to be present in the bar.

The various mixtures are placed in respective vibrating dispensers 40, 42, only two of which are shown in FIG. 6. The output delivered by each dispenser is controlled by the amplitude of the oscillations applied thereto and by adjusting its outlet section 41, 43.

Depending on the composition required at a given level of the bar, mixtures of powder are extracted from a single dispenser or from a plurality of dispensers simultaneously, with the delivery rates therefrom being adjusted.

The powders extracted from the dispensers pass through a grid or screen 44 and are conveyed by a mixer 45 to a mold 46, itself carried by a vibrating table 48.

The mixer 45 serves to ensure that the mixtures of powder, possibly coming from a plurality of dispensers, are homogenized. It is possible to use a rotary mixer with fins as shown. Other types of powder mixer can also be used, for example vibrating mixers.

It is thus possible to make a smooth transition in the composition of the bar from one layer to another by progressively increasing outflow from one or more dispensers while progressively decreasing outflow from one or more other dispensers.

Example 1

A bar made up of two distinct layers was made using an installation of the kind shown in FIG. 5.

A mixture of powders made up as follows was introduced into a first dispenser:

93 grams (g) of zirconia powder $ZrO_2$ and 7 g of yttrium oxide powder $Y_2O_3$ in the form of granules of size equal to about 150 micrometers ($\mu$m) were mixed in an aqueous medium together with an organic binder; and the mixture was dried.

A mixture of powders made as follows was introduced into a second dispenser:

93 g of zirconia powder $ZrO_2$, 7 g of yttrium oxide $Y_2O_3$, and 5.26 g of nickel oxide powder NiO in the form of granules of size equal to about 150 $\mu$m were mixed in an aqueous medium together with an organic binder; and the mixture was dried.

The powder mixture contained in the first dispenser was introduced initially into a cylindrical mold of circular section having a diameter of 50 millimeters (mm) and a height of 150 mm, until a depth of 75 mm was reached, after which the mold was filled to the top using the powder mixture coming from the second dispenser.

The powder contained in the mold was compacted by cold isostatic pressing under a pressure of 60 MPa and then baked at 1200° C. for 60 minutes (min).

The resulting bar was unmolded and ready for use, being consumed starting from its face comprising only $ZrO_2$+$Y_2O_3$ in order to form a ceramic coating having an inner layer of YSZ bonded on the thermal barrier metal underlayer, and an outer layer of YSZ modified by added NiO for reducing thermal conductivity and thus encouraging the establishment of a very steep temperature gradient through the thermal barrier.

Naturally, the number of distinct layers in the bar could be greater than two, for example by including one or more intermediate layers in which the NiO powder is present but at a concentration intermediate between zero and the concentration contained in the top layer.

Example 2

A bar comprising a composition that varied without steps was made by means of the installation of FIG. 6 by introducing the same mixtures as mentioned in Example 1 respectively in first and second dispensers, i.e. $ZrO_2$+7% $Y_2O_3$ and $ZrO_2$+7% $Y_2O_3$+5% NiO. A mold identical to that of Example 1 was filled as follows:

first dispenser set to maximum delivery rate for a length of time sufficient for obtaining a depth of powder in the mold equal to about 50 mm, the second dispenser being closed;

the first dispenser was closed progressively while the second dispenser was opened progressively so as to obtain a continuous composition gradient over a depth of about 60 mm in the mold; and the second dispenser was fully opened and the first dispenser closed until the mold was completely full.

The powders in the mold were compacted by cold isostatic pressing at 60 MPa and the powders were then baked at 1230° C. for 60 min.

After unmolding, a bar was obtained whose composition varied progressively from a layer made of $ZrO_2$+7% $Y_2O_3$ to a layer made of $ZrO_2$+7% $Y_2O_3$+5% NiO. The bar was used by being consumed starting from the layer made of $ZrO_2$+7% $Y_2O_3$ in order to form a ceramic coating having a progressive composition gradient with thermal conductivity decreasing in its outer portion.

What is claimed is:

1. A method of forming a ceramic coating on a substrate by electron-beam physical vapor deposition, the method comprising the steps of:

placing in a chamber a composite target in the form of a bar made up of ceramic powder and presenting a composition that is not uniform in the longitudinal direction;

introducing into the chamber at least one substrate on which a ceramic coating having a composition gradient is to be formed; and sweeping a top face of the bar with an electron beam in order to melt the bar material at its top face and form a vapor cloud in the chamber at low pressure, wherein:

a bar is used that presents at least three layers of different compositions, the composition within each layer being uniform over the entire cross-section of the bar, and each layer comprising zirconia and at least one oxide selected from the oxides of nickel, cobalt, iron, yttrium, hafnium, cerium, lanthanum, tantalum, niobium, scandium, samarium, gadolinium, dysprosium, ytterbium, and aluminum; and the ceramic coating formed on the substrate by progressively consuming the bar reflects the variation in the composition of the bar.

2. A method according to claim 1, wherein a bar is used of composition that varies substantially continuously from one layer to another.

3. A method according to claim 1, wherein a bar is used of composition that varies stepwise from one layer to another.

4. A method according to claim 3, wherein the bar is made by superposing disks of different compositions.

5. A method according to claim 1, for forming a ceramic coating on a substrate constituted by a gas turbine part made of superalloy provided with a thermal barrier metal underlayer.

6. A method according to claim 1, wherein a bar is used having at least one layer further including a compound selected from compounds of the pyrochlore type, compounds of the garnet type, and compounds of magnetoplumbite structure.

7. A method of forming a gradient ceramic coating on a substrate using electron-beam physical vapor deposition, comprising:

in a process chamber in which the substrate is disposed, vaporizing a composite ceramic target member using an electron beam; and allowing the resultant vapor to deposit on the substrate so as to form the ceramic coating, wherein the composite ceramic target member is elongate and includes a plurality of layers along a long axis thereof, each layer having a different composition, wherein vaporizing the composite ceramic target member comprises sequentially vaporizing the plurality of layers constituting the composite ceramic target member to sequentially obtain a plurality of vapors each corresponding to a respective layer, and wherein allowing the resultant vapor to deposit on the substrate comprises allowing each of the plurality of vapors to sequentially deposit on the substrate so as to form a ceramic coating with a composition that varies along its thickness in correspondence with the sequence of layers in the composite ceramic target member.

8. The method according to claim 7, wherein each layer in the composite ceramic target member comprises zirconia and at least one oxide selected from the oxides of nickel, cobalt, iron, yttrium, hafnium, cerium, lanthanum, tantalum, niobium, scandium, samarium, gadolinium, dysprosium, ytterbium, and aluminum.

9. The method according to claim 7, wherein the plurality of layers in the composite ceramic target member varies substantially stepwise between layers.

10. The method according to claim 9, wherein the composite ceramic target member comprises a stacked plurality of physically distinct members each having respective compositions.

11. The method according to claim 7, wherein the plurality of layers in the composite ceramic target member varies substantially continuously between layers.

12. The method according to claim 8, wherein at least one of the layers further includes at least one of a pyrocholore type compound, a garnet type compound, and a magnetoplumbite type compound.

* * * * *